(12) United States Patent
Hsu et al.

(10) Patent No.: US 6,906,750 B2
(45) Date of Patent: Jun. 14, 2005

(54) OPTICAL APPARATUS AND METHOD FOR MAKING THE SAME

(75) Inventors: Fang-Sheng Hsu, Hsinchu (TW); Kuo-Hsiung Li, Hsinchu (TW)

(73) Assignee: Pixert Imaging Inc., Hsinchu (TW)

( * ) Notice: Subject to any disclaimer, the term of this patent is extended or adjusted under 35 U.S.C. 154(b) by 42 days.

(21) Appl. No.: 10/355,340

(22) Filed: Jan. 31, 2003

(65) Prior Publication Data

US 2004/0004276 A1 Jan. 8, 2004

(30) Foreign Application Priority Data

Jul. 3, 2002 (TW) .......................................... 91114750 A

(51) Int. Cl.[7] .............................................. H04N 5/225

(52) U.S. Cl. ...................... 348/335; 257/59; 257/676; 257/738; 348/360; 348/363

(58) Field of Search .......................... 257/59, 676, 738; 348/335, 360, 363

(56) References Cited

U.S. PATENT DOCUMENTS

| | | | | | |
|---|---|---|---|---|---|
| 4,956,546 A | * | 9/1990 | Nishibe et al. | .......... | 250/203.1 |
| 5,463,229 A | * | 10/1995 | Takase et al. | .................. | 257/59 |
| 6,498,624 B1 | * | 12/2002 | Ogura et al. | ................. | 348/335 |
| 6,578,989 B2 | * | 6/2003 | Osumi et al. | ................ | 362/298 |

* cited by examiner

*Primary Examiner*—David Nelms
*Assistant Examiner*—Dao H. Nguyen
(74) *Attorney, Agent, or Firm*—Townsend and Townsend and Crew LLP

(57) ABSTRACT

An optical apparatus includes an optical semiconductor device and a lens assembly mounted on opposite surfaces of a substrate. The height of a surrounding wall and the thickness of a cover member of a semiconductor package of the optical semiconductor device are selected so that, when the cover member and the lens assembly abut directly against the opposite surfaces of the substrate, an optimum optical distance will be formed between a lens set of the lens assembly and a light-sensing portion of an optical semiconductor chip in the semiconductor package. A method for making the optical apparatus is also disclosed.

10 Claims, 2 Drawing Sheets

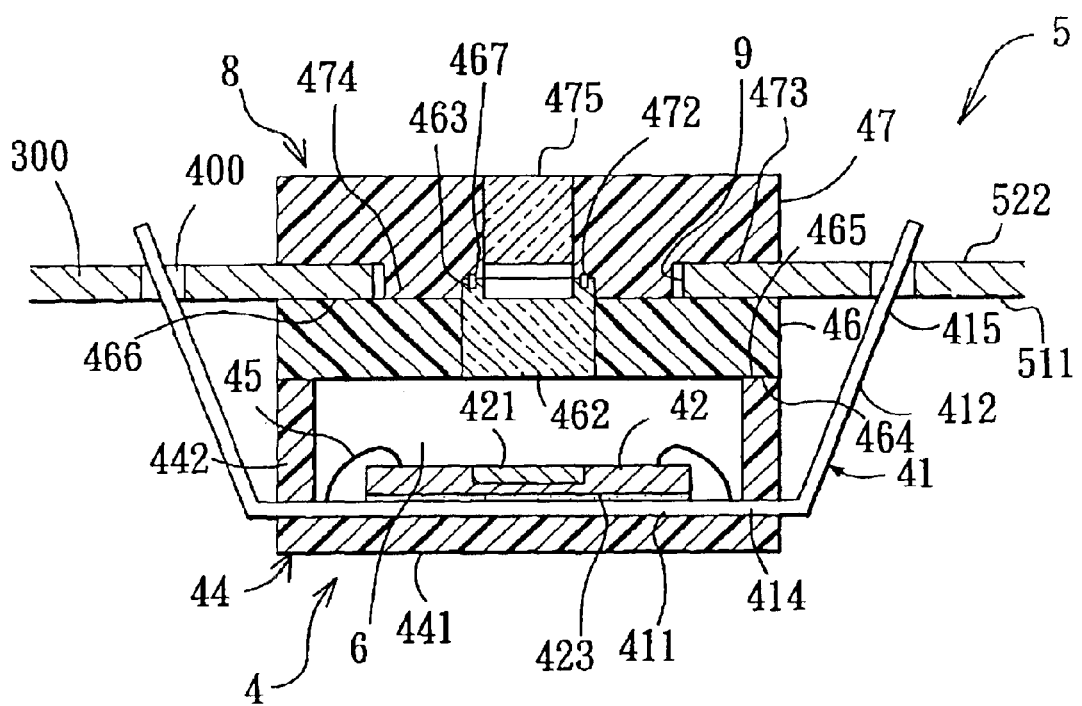
F I G. 2

OPTICAL APPARATUS AND METHOD FOR MAKING THE SAME

CROSS-REFERENCE TO RELATED APPLICATION

This application claims priority of Taiwanese Application No. 091114750, filed on Jul. 3, 2002.

BACKGROUND OF THE INVENTION

1. Field of the Invention

The present invention relates to an optical apparatus that includes an optical semiconductor device and a lens assembly mounted on opposite surfaces of a substrate, and to a method for making the optical apparatus.

2. Description of the Related Art

Precise electrical connections and light transmission paths are crucial to the performance of an optical apparatus. Accordingly, there is a need to mount components of the optical apparatus precisely on a substrate such that the optical apparatus can receive light properly and generate accurate electrical signals.

Referring to FIG. 1, a conventional optical apparatus 1 is shown to include a substrate 100, an optical semiconductor device 19, and a lens assembly 16.

The substrate 100 has a first surface 101, a second surface 102 opposite to the first surface 101, and a plurality of lead holes 200 extending through the first and second surfaces 101, 102 of the substrate 100.

The optical semiconductor device 19 includes a semiconductor package 13, a lead frame 11, an optical semiconductor chip 12, and a plurality of bonding wires 14.

The semiconductor package 13, which is injection molded from plastic materials, includes a base wall 131, a surrounding wall 132 extending from a periphery of the base wall 131 and cooperating with the base wall 131 to form a chip-receiving space 17, and a cover 15 disposed opposite to the base wall 131 and secured to the surrounding wall 132 for closing the chip-receiving space 17. The cover 15 has a wall-connecting surface 152 connected to the surrounding wall 132, and is formed with a light-guiding portion 151 that permits passage of light into the chip-receiving space 17.

The lead frame 11 is made of metal, and includes a chip carrier 111 mounted on the base wall 131 in the chip-receiving space 17, and a plurality of leads 112. Each of the leads 112 has a chip-connecting portion 114 disposed in the chip-receiving space 17, and a substrate-connecting portion 115 extending through the surrounding wall 132 and to be mounted on the substrate 100 in a respective one of the lead holes 200, such as by soldering, so as to secure the optical semiconductor device 19 on the substrate 100.

The optical semiconductor chip 12 has a carrier-mounting portion 113 and a light-sensing portion 121 opposite to the carrier-mounting portion 113. The carrier-mounting portion 113 is mounted on the chip carrier 111 of the lead frame 11 such that the light-sensing portion 121 is optically aligned with the light-guiding portion 151 of the cover 15 when the cover 15 is secured to the surrounding wall 132.

The bonding wires 14 are metal wires and are used to wire-bond the optical semiconductor chip 12 to the chip-connecting portions 114 of the leads 112, respectively, before the cover 15 is secured to the surrounding wall 132.

The lens assembly 16 includes a lens frame 161 and a lens set 162 mounted in the lens frame 161. The lens frame 161 is mounted on the second surface 101 of the substrate 100 such that the lens set 162 is optically aligned with the light-guiding portion 151 of the cover 15, thereby permitting light from the lens set 162 to pass through a light passage 201 in the substrate 100 and the light-guiding portion 151 of the cover 15 for reception by the light-sensing portion 121 of the optical semiconductor chip 12 so that corresponding electrical signals can be generated accordingly.

During the manufacture of the optical apparatus 1, an optimum optical distance is required to be formed between the lens set 162 and the light-sensing portion 121 of the optical semiconductor chip 12 in order for the optical apparatus 1 to generate electrical signals accurately. However, since the lens assembly 16 is mounted on the substrate 100, the depth of the substrate-connecting portion 115 of each of the leads 112 extending through the respective one of the lead holes 200 has to be precisely controlled before installing the lens assembly 16.

Therefore, when making the conventional optical apparatus 1, the distance between the light-guiding portion 151 of the cover 15 and the optical semiconductor chip 12 has to be measured. Then, a rectangular frame 2 is prepared, the height of which corresponds to the difference between the optimum optical distance between the lens set 162 and the light-sensing portion 121 of the optical semiconductor chip 12 and the measured distance between the light-guiding portion 151 and the optical semiconductor chip 12. Accordingly, the rectangular frame 2 has a top surface 22 and a bottom surface 23 opposite to the top surface 22. The top surface 22 abuts directly against the first surface, 101 of the substrate 100, whereas the bottom surface 23 abuts directly against the cover 15.

The method for making the optical apparatus 1 begins with the preparation of the substrate 100, the optical semiconductor device 19, and the lens assembly 16. To prepare the optical semiconductor device 19, the optical semiconductor chip 12 is first mounted on the chip carrier 111 of the lead frame 11. Then, the base wall 131 and the surrounding wall 132 of the semiconductor package 13 are formed on the lead frame 11 by injection molding such that the chip carrier 111 is mounted on the base wall 131 in the chip-receiving space 17, and such that the substrate-connecting portions 115 of the leads 112 extend through the surrounding wall 132. Next, the optical semiconductor chip 12 is wire-bonded to the chip-connecting portions 114 of the leads 112. Finally, the cover 15 is mounted on the surrounding wall 132 to close the chip-receiving space 17. The light-guiding portion 151 of the cover 15 is optically aligned with the light-sensing portion 121 of the optical semiconductor chip 12 at this time.

When assembling the optical semiconductor device 19 and the lens assembly 16 on the substrate 100, a skilled artisan has to first install the rectangular frame 2 such that the top surface 22 of the rectangular frame 2 abuts directly against the first surface 101 of the substrate 100 and such that the bottom surface 23 of the rectangular frame 2 abuts directly against the cover 15. The substrate-connecting portion 115 of each of the leads 112 is then inserted through the respective lead hole 200 in the substrate 100. Next, the unfinished optical apparatus 1 is turned 180° to commence soldering of the substrate-connecting portions 115 of the leads 112 to the substrate 100 so as to establish electrical connection between the optical semiconductor device 19 and the substrate 100 and so as to secure the optical semiconductor device 19 on the substrate 100. The lens frame 161 of the lens assembly 16 is secured to the second surface 102 of the substrate 100 thereafter such that the light-guiding portion 151 of the cover 15 is optically aligned with the lens set 162. The optical apparatus 1 is completed at this time.

Although the presence of the rectangular frame 2 can assure the optimum optical distance between the lens set 162 and the light-sensing portion 121 of the optical semiconductor chip 12, there are some drawbacks that have to be resolved. Particularly, processing errors inherently present in the top and bottom surfaces 22, 23 of the rectangular frame 2 can result in improper optical alignment among the lens assembly 16, the light-guiding portion 151 of the cover 15, and the light-sensing portion 121 of the optical semiconductor chip 12, thereby affecting the accuracy of the electrical signals generated by the optical semiconductor chip 12. In addition, there is a need to prepare rectangular frames 2 of different sizes since a particular lens assembly 16 will require a specific size of the rectangular frame 2. This not only increases the production costs, but also raises another problem due to possible use of an incorrect rectangular frame 2, which can result in malfunction of the optical apparatus 1.

SUMMARY OF THE INVENTION

Therefore, the object of the present invention is to provide an optical apparatus that does not require the use of an additional frame to maintain an optimum optical distance when mounting an optical semiconductor device and a lens assembly on opposite surfaces of a substrate so as to overcome the above drawbacks encountered in the prior art.

Another object of the present invention is to provide a method for making the optical apparatus of this invention.

According to one aspect of the invention, an optical apparatus includes a substrate, an optical semiconductor device, and a lens assembly.

The substrate has a first surface, a second surface opposite to the first surface, and a light passage formed through the first and second surfaces.

The optical semiconductor device includes a semiconductor package, a lead frame, and an optical semiconductor chip.

The semiconductor package includes a base wall, a surrounding wall extending from a periphery of the base wall and cooperating with the base wall to form a chip-receiving space, and a cover member disposed opposite to the base wall and secured to the surrounding wall for closing the chip-receiving space. The cover member has a wall-connecting surface connected to the surrounding wall, and a substrate-abutting surface that abuts directly against the first surface of the substrate. The cover member further has a light-guiding portion that is optically aligned with the light passage to permit passage of light into the chip-receiving space.

The lead frame includes a chip carrier mounted on the base wall in the chip-receiving space, and a plurality of leads. Each of the leads has a chip-connecting portion disposed in the chip-receiving space, and a substrate-connecting portion extending through the surrounding wall and mounted on the substrate to secure the optical semiconductor device on the first surface of the substrate.

The optical semiconductor chip has a carrier-mounting portion and a light-sensing portion opposite to the carrier-mounting portion. The carrier-mounting portion is mounted on the chip carrier such that the light-sensing portion is optically aligned with the light guiding portion. The optical semiconductor chip is connected electrically to the chip-connecting portions of the leads such that electrical connection between the optical semiconductor chip and the substrate is possible through the leads.

The lens assembly includes a lens frame and a lens set mounted in the lens frame. The lens frame has a mounting surface mounted on the second surface of the substrate such that the lens set is optically aligned with the light passage.

The surrounding wall has a height and the cover member has a thickness that cooperate to form an optimum optical distance between the lens set and the light-sensing portion of the optical semiconductor chip.

According to another aspect of the invention, an optical apparatus is adapted to be mounted on a substrate that has a first surface, a second surface opposite to the first surface, and a light passage formed through the first and second surfaces. The optical apparatus includes an optical semiconductor device and a lens assembly.

The optical semiconductor device includes a semiconductor package, a lead frame, and an optical semiconductor chip.

The semiconductor package includes a base wall, a surrounding wall extending from a periphery of the base wall and cooperating with the base wall to form a chip-receiving space, and a cover member disposed opposite to the base wall and secured to the surrounding wall for closing the chip-receiving space. The cover member has a wall-connecting surface connected to the surrounding wall, and a substrate-abutting surface adapted to abut directly against the first surface of the substrate. The cover member has a light-guiding portion that is to be disposed in optical alignment with the light passage to permit passage of light into the chip-receiving space when the substrate-abutting surface abuts directly against the first surface of the substrate.

The lead frame includes a chip carrier mounted on the base wall in the chip-receiving space, and a plurality of leads. Each of the leads has a chip-connecting portion disposed in the chip-receiving space, and a substrate-connecting portion extending through the surrounding wall and adapted to be mounted on the substrate so as to secure the optical semiconductor device on the first surface of the substrate.

The optical semiconductor chip has a carrier-mounting portion and a light-sensing portion opposite to the carrier-mounting portion. The carrier-mounting portion is mounted on the chip carrier such that the light-sensing portion is optically aligned with the light-guiding portion. The optical semiconductor chip is connected electrically to the chip-connecting portions of the leads such that electrical connection between the optical semiconductor chip and the substrate is possible through the leads.

The lens assembly includes a lens frame and a lens set mounted in the lens frame. The lens frame has a mounting surface adapted to be mounted on the second surface of the substrate such that the lens set is disposed in optical alignment with the light passage.

The lens set and the light-sensing portion of the optical semiconductor chip form an optimum optical distance therebetween. The substrate-abutting surface of the cover member and the mounting surface of the lens frame form a clearance corresponding to the thickness of the substrate to permit the substrate-abutting surface and the mounting surface to abut directly and respectively against the first and second surfaces of the substrate when the optical apparatus is mounted on the substrate.

According to a further aspect of the invention, a method for making an optical apparatus comprises the following steps:

(a) preparing a substrate having a first surface, a second surface opposite to the first surface, and a light passage formed through the first and second surfaces;

(b) preparing an optical semiconductor device that includes a semiconductor package including a base wall, a surrounding wall extending from a periphery of the base wall and cooperating with the base wall to form a chip-receiving space, and a cover member disposed opposite to the base wall and secured to the surrounding wall for closing the chip-receiving space, the cover member having a wall-connecting surface connected to the surrounding wall and a substrate-abutting surface opposite to the wall-connecting surface, the cover member further having a light-guiding portion that permits passage of light into the chip-receiving space, a lead frame including a chip carrier mounted on the base wall in the chip-receiving space, and a plurality of leads, each of which has a chip-connecting portion disposed in the chip-receiving space, and a substrate-connecting portion extending through the surrounding wall, and an optical semiconductor chip having a carrier-mounting portion and a light-sensing portion opposite to the carrier-mounting portion, the carrier-mounting portion being mounted on the chip carrier such that the light-sensing portion is optically aligned with the light guiding portion, the optical semiconductor chip being connected electrically to the chip-connecting portions of the leads;

(c) mounting the optical semiconductor device on the substrate such that the substrate-abutting surface abuts directly against the first surface of the substrate, such that the light-guiding portion is optically aligned with the light passage, and such that the substrate-connecting portions of the leads are mounted on the substrate so as to secure the optical semiconductor device on the substrate and so as to establish electrical connection between the optical semiconductor chip and the substrate;

(d) preparing a lens assembly that includes a lens frame and a lens set mounted in the lens frame; and (e) mounting a mounting surface of the lens frame on the second surface of the substrate such that the lens set is optically aligned with the light passage and forms an optimum optical distance with the light-sensing portion of the optical semiconductor chip.

BRIEF DESCRIPTION OF THE DRAWINGS

Other features and advantages of the present invention will become apparent in the following detailed description of the preferred embodiment of the invention, with reference to the accompanying drawings, in which:

FIG. 2 illustrates the preferred embodiment of an optical apparatus according to the present invention.

DETAILED DESCRIPTION OF THE PREFERRED EMBODIMENT

Figure 1:
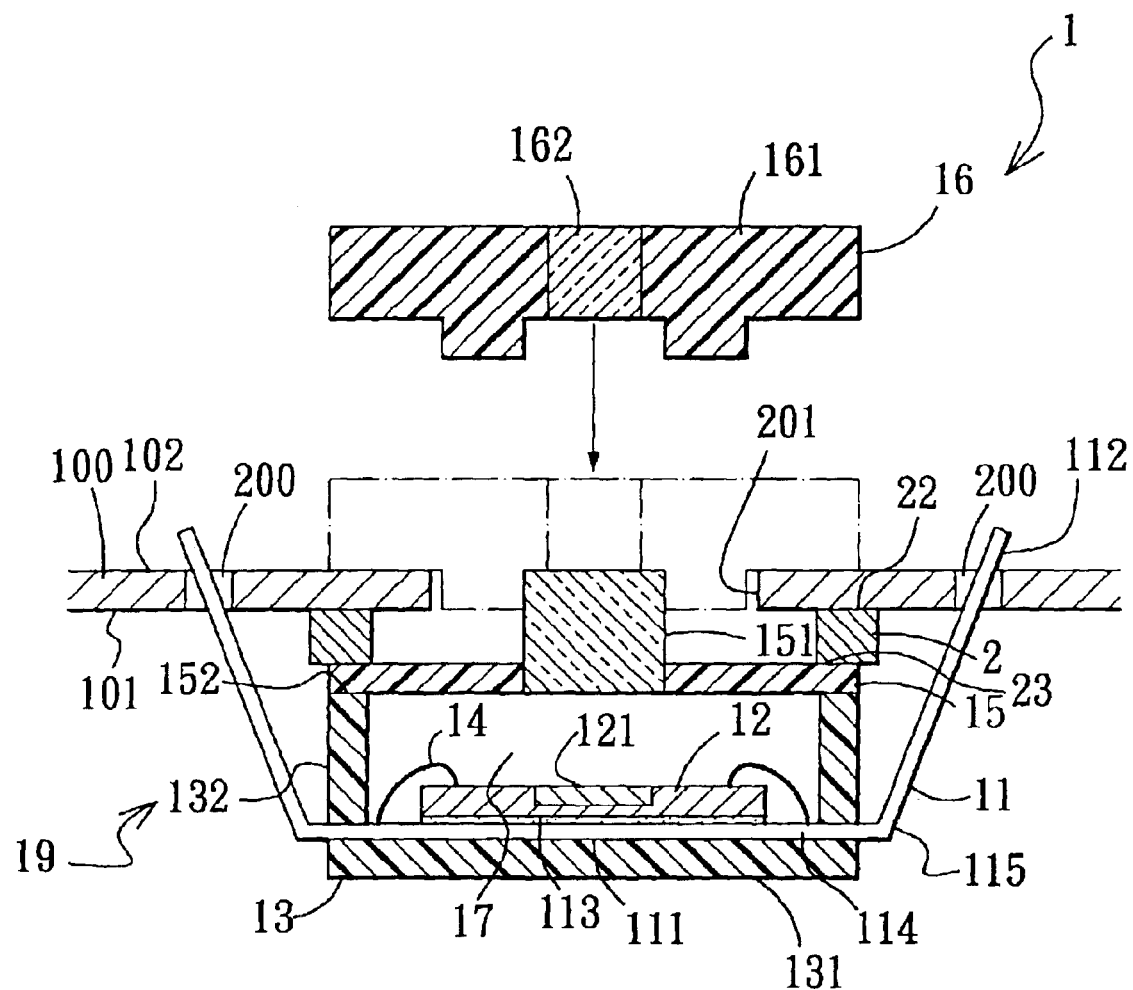
FIG. 1 illustrates a conventional optical apparatus.

Referring to FIG. 2, the preferred embodiment of an optical apparatus 5 according to the present invention is shown to include a substrate 300, an optical semiconductor device 4, and a lens assembly 8.

The substrate 300 has a first surface 511, a second surface 522 opposite to the first surface 511, and a light passage 9 formed through the first and second surfaces 511, 522. The substrate 300 is further formed with a plurality of lead holes 400 through the first and second surfaces 511, 522 and disposed around the light passage 9.

The optical semiconductor device 4 includes a semiconductor package 44, a lead frame 41, and an optical semiconductor chip 42.

The semiconductor package 44 includes a base wall 441, a surrounding wall 442, and a cover member 46. The surrounding wall 442 extends from a periphery of the base wall 441 and cooperates with the base wall 441 to form a chip-receiving space 6. The cover member 46 is disposed opposite to the base wall 441 and is secured to the surrounding wall 442 for closing the chip-receiving space 6. The cover member 46 has a wall-connecting surface 465, which is connected to the surrounding wall 442, and a substrate-abutting surface 466 that abuts directly against the first surface 511 of the substrate 300. The cover member 46 further has a light-guiding portion 462 that is optically aligned with the light passage 9 to permit passage of light into the chip-receiving space 6. In this embodiment, the light-guiding portion 462 projects from the substrate-abutting surface 466 of the cover member 46 and extends into the light passage 9.

The lead frame 41 includes a chip carrier 411 mounted on the base wall 441 in the chip-receiving space 6, and a plurality of leads 412. Each of the leads 412 has a chip-connecting portion 414 disposed in the chip-receiving space 6, and a substrate-connecting portion 415 extending through the surrounding wall 442 and mounted on the substrate 300 to secure the optical semiconductor device 4 on the first surface 511 of the substrate 300. Particularly, the substrate-connecting portion 415 of each of the leads 412 is soldered to the substrate 300 in a respective one of the lead holes 400. Preferably, the leads 412 are distributed with respect to the center of the chip carrier 411.

The optical semiconductor chip 42 has a carrier-mounting portion 423 and a light-sensing portion 421 opposite to the carrier-mounting portion 423. The carrier-mounting portion 423 is mounted on the chip carrier 411 with the use of an adhesive such that the light-sensing portion 421 is optically aligned with the light guiding portion 462. In addition, the optical semiconductor chip 42 is connected electrically to the chip-connecting portion 414 of the leads 412 such that electrical connection between the optical semiconductor chip 42 and the substrate 300 is possible through the leads 412. In this embodiment, a plurality of metal bonding wires 45 wire-bond the optical semiconductor chip 42 to the chip-connecting portions 414 of the leads 412, respectively.

The lens assembly 8 includes a lens frame 47 and a lens set 475 mounted in the lens frame 47. The lens frame 47 has a mounting surface 473 mounted on the second surface 522 of the substrate 300 such that the lens set 475 is optically aligned with the light passage 9. Preferably, the lens frame 47 has a tubular coupling portion 474 projecting from the mounting surface 473. The tubular coupling portion 474 extends into the light passage 9 for coupling with the light-guiding portion 462 of the cover member 46.

Moreover, an interlocking unit 467 includes three locking tongues 472 provided on the tubular coupling portion 474, and three locking grooves 463 provided in the light-guiding portion 462 to engage the locking tongues 472, respectively.

In the optical apparatus 5 of the present invention, the surrounding wall 442 has a height and the cover member 46 has a thickness that cooperate to form an optimum optical distance between the lens set 475 and the light-sensing portion 421 of the optical semiconductor chip 42. Accordingly, the substrate-abutting surface 466 of the cover member 46 and the mounting surface 473 of the lens frame 47 form a clearance corresponding to the thickness of the substrate 300 to permit the substrate-abutting surface 466 and the mounting surface 473 to abut directly and respectively against the first and second surfaces 511, 522 of the substrate 300 when the optical apparatus 5 is mounted on the substrate 300.

The method for making the optical apparatus 5 of the present invention includes the steps of preparing the substrate 300, preparing the optical semiconductor device 4, mounting the optical semiconductor device 4 on the substrate 300, preparing the lens assembly 8, and mounting the lens frame 47 on the substrate 300.

To prepare the optical semiconductor device 4, the carrier-mounting portion 423 of the optical semiconductor chip 42 is first mounted adhesively on the chip carrier 411 of the lead frame 41. Then, the base wall 441 and the surrounding wall 442 of the semiconductor package 44 are formed on the lead frame 41 by injection molding in a conventional manner such that the chip carrier 411 is mounted on the base wall 441 in the chip-receiving space 6, and such that the substrate-connecting portions 415 of the leads 412 extend through the surrounding wall 442. Preferably, a positioning device (not shown) supports the chip carrier 411 at symmetrical positions when forming the base and surrounding walls 441, 442. Thereafter, the optical semiconductor chip 42 is wire-bonded to the chip-connecting portions 414 of the leads 412, and the wall-connecting surface 465 of the cover member 46 is subsequently mounted on the surrounding wall 442 to close the chip-receiving space 6.

When mounting the optical semiconductor device 4 on the substrate 300, the substrate-abutting surface 466 of the cover member 46 is disposed to abut directly against the first surface 511 of the substrate 300 such that the light-guiding portion 462 is optically aligned with the light passage 9. The substrate-connecting portions 415 of the leads 412 are then mounted on the substrate 300 so as to secure the optical semiconductor device 4 on the substrate 300 and so as to establish electrical connection between the optical semiconductor chip 42 and the substrate 300. In the preferred embodiment, the substrate-connecting portions 415 of the leads 412 are extended respectively through the lead holes 400, which are disposed around the light passage 9, and are soldered to the substrate 300 there at.

When mounting the lens frame 47 on the substrate 300, the mounting surface 473 of the lens frame 47 is disposed to abut directly against the second surface 522 of the substrate 300 such that the lens set 475 is optically aligned with the light passage 9. At this time, because the light-guiding portion 462 projects from the substrate-abutting surface 466 of the cover member 46 and extends into the light passage 9, and because the tubular coupling portion 474 of the lens frame 47 projects from the mounting surface 473 and extends into the light passage 9, the locking tongues 472 can engage the locking grooves 463 to ensure coupling between the tubular coupling portion 474 and the light-guiding portion 462.

In the present invention, by selecting the height of the surrounding wall 442 and the thickness of the cover member 46, an optimum optical distance can be formed between the lens set 475 and the light-sensing portion 421 of the optical semiconductor chip 42 while the cover member 46 and the lens frame 47 abut directly against the first and second surfaces 511, 522 of the substrate 300. Therefore, there is no need to use the rectangular frame 2 of the prior art, which results in a significant reduction in production costs and in the possibility of human error during the manufacture of the optical apparatus of the present invention.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

We claim:
1. An optical apparatus comprising:
a substrate having a first surface, a second surface opposite to said first surface, and a light passage formed through said first and second surfaces;
an optical semiconductor device including
a semiconductor package including a base wall, a surrounding wall extending from a periphery of said base wall and cooperating with said base wall to form a chip-receiving space, and a cover member disposed opposite to said base wall and secured to said surrounding wall for closing said chip-receiving space, said cover member having a wall-connecting surface connected to said surrounding wall and a substrate-abutting surface that abuts directly against said first surface of said substrate, said cover member having a light-guiding portion that is optically aligned with said light passage to permit passage of light into said chip-receiving space,
a lead frame including a chip carrier mounted on said base wall in said chip-receiving space, and a plurality of leads, each of which has a chip-connecting portion disposed in said chip-receiving space, and a substrate-connecting portion extending through said surrounding wall and mounted on said substrate to secure said optical semiconductor device on said first surface of said substrate, and
an optical semiconductor chip having a carrier-mounting portion and a light-sensing portion opposite to said carrier-mounting portion, said carrier-mounting portion being mounted on said chip carrier such that said light-sensing portion is optically aligned with said light guiding portion, said optical semiconductor chip being connected electrically to said chip-connecting portions of said leads such that electrical connection between said optical semiconductor chip and said substrate is possible through said leads; and
a lens assembly including a lens frame and a lens set mounted in said lens frame, said lens frame having a mounting surface mounted on said second surface of said substrate such that said lens set is optically aligned with said light passage;
wherein said surrounding wall has a height and said cover member has a thickness that cooperate to form an optimum optical distance between said lens set and said light-sensing portion of said optical semiconductor chip.

2. The optical apparatus as claimed in claim 1, wherein said optical semiconductor device further includes a plurality of bonding wires for wire-bonding said optical semiconductor chip to said chip-connecting portions of said leads, respectively.

3. The optical apparatus as claimed in claim 1, wherein said substrate is further formed with a plurality of lead holes through said first and second surfaces and disposed around said light passage, said substrate-connecting portion of each of said leads being soldered to said substrate in a respective one of said lead holes.

4. The optical apparatus as claimed in claim 1, wherein said light-guiding portion projects from said substrate-abutting surface of said cover member and extends into said light passage, said lens frame having a tubular coupling portion projecting from said mounting surface and extending into said light passage for coupling with said light-guiding portion.

5. The optical apparatus as claimed in claim 4, further comprising an interlocking unit that includes a locking tongue provided on one of said tubular coupling portion and said light-guiding portion, and a locking groove provided in the other of said tubular coupling portion and said light-guiding portion to engage said locking tongue.

6. An optical apparatus adapted to be mounted on a substrate that has a first surface, a second surface opposite to the first surface, and a light passage formed through the first and second surfaces, said optical apparatus comprising:

an optical semiconductor device including a semiconductor package including a base wall, a surrounding wall extending from a periphery of said base wall and cooperating with said base wall to form a chip-receiving space, and a cover member disposed opposite to said base wall and secured to said surrounding wall for closing said chip-receiving space, said cover member having a wall-connecting surface connected to said surrounding wall and a substrate-abutting surface adapted to abut directly against the first surface of the substrate, said cover member having a light-guiding portion that is to be disposed in optical alignment with the light passage to permit passage of light into said chip-receiving space when said substrate-abutting surface abuts directly against the first surface of the substrate, a lead frame including a chip carrier mounted on said base wall in said chip-receiving space, and a plurality of leads, each of which has a chip-connecting portion disposed in said chip-receiving space, and a substrate-connecting portion extending through said surrounding wall and adapted to be mounted on the substrate so as to secure said optical semiconductor device on the first surface of the substrate, and an optical semiconductor chip having a carrier-mounting portion and a light-sensing portion opposite to said carrier-mounting portion, said carrier-mounting portion being mounted on said chip carrier such that said light-sensing portion is optically aligned with said light-guiding portion, said optical semiconductor chip being connected electrically to said chip-connecting portions of said leads such that electrical connection between said optical semiconductor chip and the substrate is possible through said leads; and a lens assembly including a lens frame and a lens set mounted in said lens frame, said lens frame having a mounting surface adapted to be mounted on the second surface of the substrate such that said lens set is disposed in optical alignment with the light passage;

wherein said lens set and said light-sensing portion of said optical semiconductor chip form an optimum optical distance therebetween, said substrate-abutting surface of said cover member and said mounting surface of said lens frame forming a clearance corresponding to the thickness of the substrate to permit said substrate-abutting surface and said mounting surface to abut directly and respectively against the first and second surfaces of the substrate when said optical apparatus is mounted on the substrate.

7. The optical apparatus as claimed in claim 6, wherein said optical semiconductor device further includes a plurality of bonding wires for wire-bonding said optical semiconductor chip to said chip-connecting portions of said leads, respectively.

8. The optical apparatus as claimed in claim 6, wherein said substrate-connecting portions of said leads are adapted to be soldered to the substrate at positions around the light passage.

9. The optical apparatus as claimed in claim 6, wherein said light-guiding portion projects from said substrate-abutting surface of said cover member so as to be adapted to extend into the light passage, said lens frame having a tubular coupling portion projecting from said mounting surface and adapted to extend into the light passage for coupling with said light-guiding portion.

10. The optical apparatus as claimed in claim 9, further comprising an interlocking unit that includes a locking tongue provided on one of said tubular coupling portion and said light-guiding portion, and a locking groove provided in the other of said tubular coupling portion and said light-guiding portion to engage said locking tongue.

* * * * *